(12) United States Patent
Zeng et al.

(10) Patent No.: US 12,543,477 B2
(45) Date of Patent: Feb. 3, 2026

(54) DISPLAY MODULE AND DISPLAY APPARATUS COMPRISING FLEXIBLE SUBSTRATE FOR OPTIMIZING OCCUPEID SPACE OF THE DISPLAY MODULE

(71) Applicants: Chengdu BOE Optoelectronics Technology Co., Ltd., Sichuan (CN); BOE Technology Group Co., Ltd., Beijing (CN)

(72) Inventors: Wei Zeng, Beijing (CN); Zhihui Wang, Beijing (CN); Wei Qing, Beijing (CN); Shaokui Liu, Beijing (CN); Danping Shen, Beijing (CN); Jia Zeng, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 347 days.

(21) Appl. No.: 18/023,664

(22) PCT Filed: Mar. 31, 2022

(86) PCT No.: PCT/CN2022/084368
§ 371 (c)(1),
(2) Date: Feb. 27, 2023

(87) PCT Pub. No.: WO2023/184325
PCT Pub. Date: Oct. 5, 2023

(65) Prior Publication Data
US 2024/0276836 A1    Aug. 15, 2024

(51) Int. Cl.
*H10K 59/82* (2023.01)
*H01L 23/498* (2006.01)
(Continued)

(52) U.S. Cl.
CPC ....... *H10K 59/82* (2023.02); *H01L 23/49822* (2013.01); *H01L 23/552* (2013.01);
(Continued)

(58) Field of Classification Search
CPC ................. H10K 59/82; H10K 59/131; H10K 2102/311; H10K 59/90; H10K 59/87; H01L 25/18; H01L 23/49822; H01L 23/552
(Continued)

(56) References Cited

U.S. PATENT DOCUMENTS

| 2009/0213292 A1 | 8/2009 | Park et al. |
| 2019/0012007 A1 | 1/2019 | Kim et al. |

(Continued)

FOREIGN PATENT DOCUMENTS

| CN | 109213273 A | 1/2019 |
| CN | 110570772 A | 12/2019 |

(Continued)

OTHER PUBLICATIONS

CN202280000644.3 first office action dated Nov. 20, 2025.

*Primary Examiner* — Didarul A Mazumder
(74) *Attorney, Agent, or Firm* — IPro, PLLC (57) ABSTRACT

The present disclosure discloses a display module and a display apparatus, which belong to the field of display technologies. The display module includes a display panel and a circuit board. The display panel can be bonded and connected to the circuit board after being bent twice respectively by the first bending part and the second bending part, so that a first connection part of the display panel and the circuit board are laminated at one side of the back surface of the display panel further away from a display surface.

14 Claims, 6 Drawing Sheets

(51) Int. Cl.
  *H01L 23/552*   (2006.01)
  *H01L 25/18*    (2023.01)
  *H10K 59/80*    (2023.01)
  *H10K 59/90*    (2023.01)
  *H10K 102/00*   (2023.01)
(52) U.S. Cl.
  CPC ............. *H01L 25/18* (2013.01); *H10K 59/87* (2023.02); *H10K 59/90* (2023.02); *H10K 2102/311* (2023.02)
(58) Field of Classification Search
  USPC ........................................................ 257/659
  See application file for complete search history.

(56) References Cited

U.S. PATENT DOCUMENTS

| | | | |
|---|---|---|---|
| 2020/0136066 A1* | 4/2020 | Jin | ................. H10K 59/131 |
| 2022/0248534 A1 | 8/2022 | Shi et al. | |
| 2022/0310970 A1* | 9/2022 | Choi | ................. H10K 59/131 |

FOREIGN PATENT DOCUMENTS

| | | | | |
|---|---|---|---|---|
| CN | 110913573 A | | 3/2020 | |
| CN | 210836051 U | | 6/2020 | |
| CN | 111916483 A | | 11/2020 | |
| CN | 113066832 A | | 7/2021 | |
| CN | 215187554 U | | 12/2021 | |
| CN | 215526634 U | | 1/2022 | |
| CN | 114822234 A | | 7/2022 | |
| JP | 2011047977 A | | 3/2011 | |
| KR | 20160141260 | * | 12/2016 | ....... G02F 1/133305 |
| KR | 20160141260 A | * | 12/2016 | ....... G02F 1/133305 |
| KR | 20210035148 A | | 3/2021 | |

* cited by examiner

DISPLAY MODULE AND DISPLAY APPARATUS COMPRISING FLEXIBLE SUBSTRATE FOR OPTIMIZING OCCUPEID SPACE OF THE DISPLAY MODULE

CROSS-REFERENCE TO RELATED APPLICATION

This application is a U.S. national stage of international application No. PCT/CN2022/084368, filed on Mar. 31, 2022, entitled "DISPLAY MODULE AND DISPLAY APPARATUS", the disclosures of which are incorporated herein by reference in its entirety.

TECHNICAL FIELD

The present disclosure relates to the field of display technologies, in particular to a display module and a display apparatus.

BACKGROUND OF THE INVENTION

At present, with the development of the times, display apparatus is used more and more widely, and the commonly used display apparatus includes smart phones, tablet computers, smart watches, etc. The display apparatus includes a display module for displaying images.

The display module includes a display panel and a circuit board. The display panel has a display part and a connection part located at one side of the display part, the circuit board is located at one side of the display panel further away from a display surface, the display panel enables the connection part to touch the circuit board by bending the connection part to one side further away from the display surface, and the display panel and the circuit board are electrically connected.

However, the connection part between the circuit board and the display panel occupies a larger region on the back surface of the display panel.

SUMMARY OF THE INVENTION

Embodiments of the present disclosure provide a display module and a display apparatus. The technical solutions are as follows:

According to a first aspect of the present disclosure, a display module is provided. The display module includes:
 a display panel and a circuit board; wherein
 the display panel includes a display part, and a first bending part, a first connection part, a second bending part and a second connection part which extend from an edge of the display part and are connected in sequence;
 the display part has a display surface and a back surface which are opposite to each other, the first bending part, the first connection part, the second bending part and the second connection part are located at one side of the back surface further away from the display surface, and the second bending part and the second connection part are located at one side of the first connection part further away from the display surface; and
 the second connection part is bonded and connected to the circuit board.

Optionally, the display module further includes a control chip, the control chip is located at one side of the first connection part further away from the display surface, and the control chip is electrically connected to the first connection part; and
 the circuit board is located at one side of the control chip further away from the display surface, and an orthogonal projection of the circuit board on the display surface overlaps with an orthogonal projection of the control chip on the display surface.

Optionally, the display panel includes a substrate;
 the first bending part has a plurality of first connection lines located on the substrate, the second bending part has a plurality of second connection lines located on the substrate, and a quantity of the first connection lines is greater than a quantity of the second connection lines; and
 the second connection line includes a plurality of sub-connection lines connected in parallel.

Optionally, the first bending part has a first organic insulating layer, the first connection lines and a second organic insulating layer which are sequentially laminated in a direction away from the substrate;
 the second bending part has an inorganic insulating layer, the second connection lines and a third organic insulating layer which are sequentially laminated in the direction away from the substrate; and
 the second organic insulating layer and the third organic insulating layer are of same layer structures.

Optionally, a bending radius of the second bending part is greater than or equal to 0.3 mm.

Optionally, the circuit board includes a plurality of dielectric layers and a plurality of layers of conductive patterns, the plurality of dielectric layers and the conductive patterns are alternately arranged in a direction away from the display surface, and the plurality of second connection part is bonded and connected to one layer of conductive pattern in the plurality of layers of conductive patterns closer to the display surface.

Optionally, one side of the circuit board closer to the control chip has a first groove, and the control chip is at least partially located in the first groove.

Optionally, the display module further includes a shielding layer, the shielding layer is located between the control chip and an inner wall of the first groove, the shielding layer is attached to the inner wall of the first groove, and a material of the shielding layer includes metal.

Optionally, the display module further includes a heat dissipation film and a heat conduction structure, the heat dissipation film has a heat absorption part and an extension part which are connected to each other, the heat absorption part touches a surface of the control chip, and the extension part touches the heat conduction structure.

Optionally, a material of the heat dissipation film includes metal, the heat dissipation film fits the surface of the control chip, and the heat dissipation film is also configured to shield signals between the control chip and the circuit board.

Optionally, the display module further includes a stress protection layer, the second bending part has a concave surface and a convex surface which are opposite to each other, and the stress protection layer is located on the concave surface or the convex surface of the second bending part.

Optionally, the display module further includes a first support pad, and the first support pad is located between the first connection part and the second connection part and is connected to the first connection part and the second connection part respectively.

Optionally, the first support pad includes a first support part and a second support part which are arranged in a direction parallel to the display surface, the first support part is connected to the first connection part and the second connection part respectively, and the second connection part is connected to the first connection part and the circuit board respectively.

Optionally, the first support pad further includes a third support part, the third support part is located at one side of the first support part further away from the second support part, is connected to the first support part, and has a cambered surface protruding towards the second bending part, and the cambered surface matches a shape of an inner wall of the second bending part.

According to another aspect of the present disclosure, a display apparatus is provided. The display apparatus includes a power supply assembly and a display module, the display module is the above display module, and the power supply assembly is configured to supply power to the display module.

The technical solutions according to the embodiments of the present disclosure at least include the following beneficial effects.

The display module is provided and includes: a display panel and a circuit board. The display panel can be bonded and connected to the circuit board after being bent twice respectively by the first bending part and the second bending part, so that the first connection part of the display panel and the circuit board are laminated at one side of the back surface of the display panel further away from the display surface. Thus, by disposing the circuit board, the first connection part and the second connection part at the back surface of the display panel in a relatively concentrated way, an occupied region of the circuit board and the first connection part and the second connection part of the display panel at the back surface of the display panel can be reduced, and the effect of optimizing an occupied space of the display module can be realized.

BRIEF DESCRIPTION OF DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

Through the above accompanying drawings, clear embodiments of the present disclosure have been shown, and will be described in more detail later. These accompanying drawings and written descriptions are not intended to limit the scope of the concept of the present disclosure in any way, but to explain the concept of the present disclosure to those skilled in the art by referring to specific embodiments.

DETAILED DESCRIPTION

For clearer descriptions of the objectives, technical solutions, and advantages of the present disclosure, the embodiments of the present disclosure are described in detail hereinafter with reference to the accompanying drawings.

A flexible display panel refers to a display panel that can be bent. For example, the flexible display panel may be a display panel including an organic light emitting diode (OLED) device.

Figure 1:
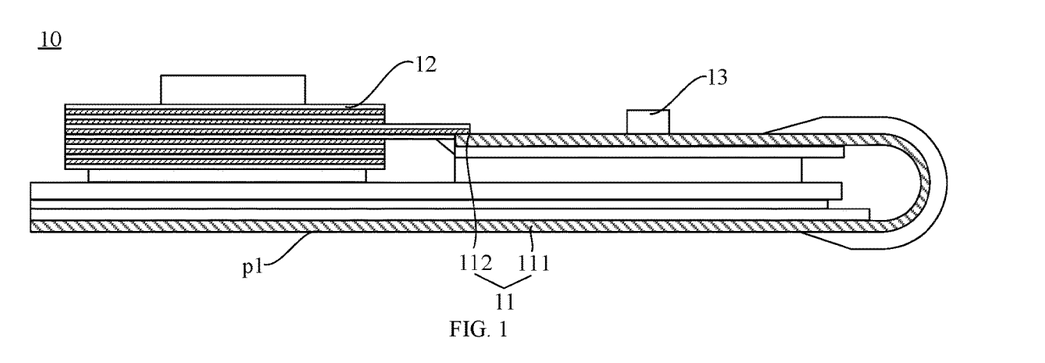
FIG. 1 is a schematic structural diagram of a display module.

As shown in FIG. 1, FIG. 1 is a schematic structural diagram of a display module. The display module 10 includes a display panel 11 and a circuit board 12. The display panel 11 has a display part 111 and a connection part 112 located on one side of the display part 111, and the circuit board 12 is located at one side of the display panel 11 further away from a display surface p1. The display panel 11 enables the connection part 112 to touch the circuit board 12 by bending the connection part 112 to one side further away from the display surface p1, thus realizing electrical connection between the display panel 11 and the circuit board 12. Thus, after the display panel 11 is bent for one time, the connection part 112 of the display panel 11 and the circuit board 12 located at the back surface of the display panel 12 are bonded and connected, so that a frame of the display module 10 can be reduced and a narrow frame design of the display module 10 can be realized. The display module 10 may further include a driver integrated chip 13 (Driver IC), and the driver integrated chip 13 may also be electrically connected to the connection part 112.

However, the connection part 112 between the circuit board 12 and the display panel 11 in the above display module 10 occupies a larger space in the direction parallel to the display surface p1.

Embodiments of the present disclosure provide a display module and a display apparatus, which can solve the problems existing in the related art.

Figure 2:
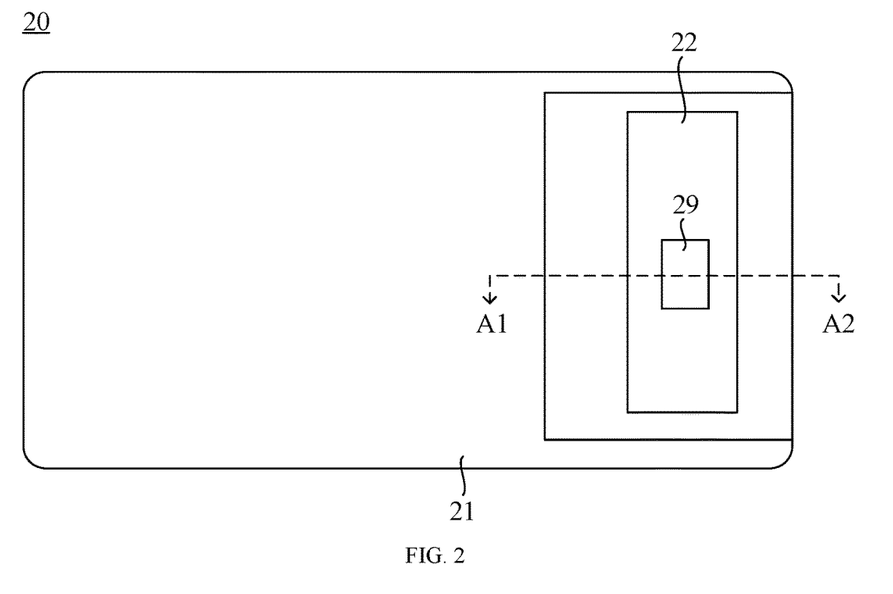
FIG. 2 is a schematic structural diagram of a display module according to an embodiment of the present disclosure.
Figure 3:
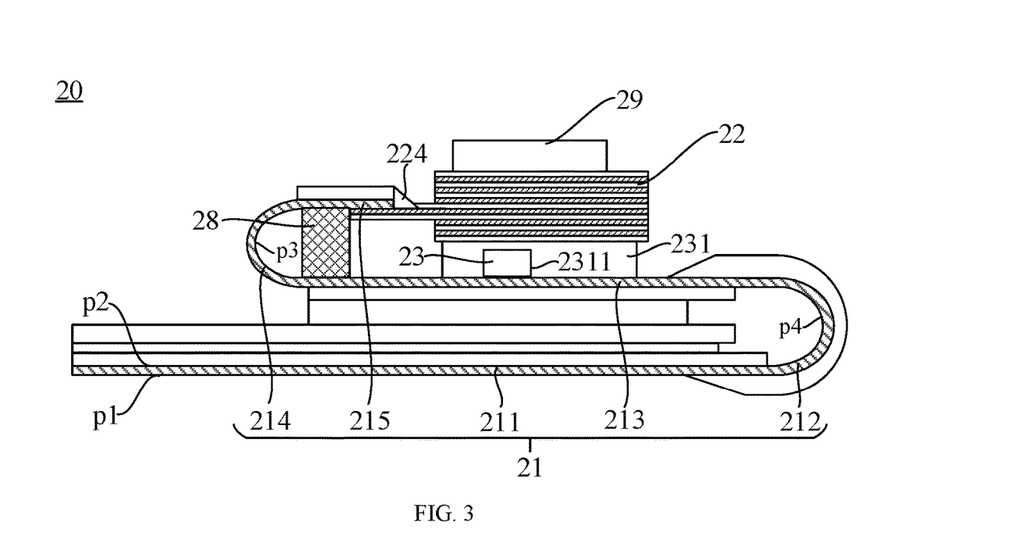
FIG. 3 is a cross-sectional schematic structural diagram of the display module shown in FIG. 2 along position A1-A2.

FIG. 2 is a schematic structural diagram of a display module according to an embodiment of the present disclosure, and FIG. 3 is a cross-sectional schematic structural diagram of the display module shown in FIG. 2 along position A1-A2. Please refer to FIG. 2 and FIG. 3, the display module 20 may include a display panel 21 and a circuit board 22. The display panel 21 may include a display part 211, and a first bending part 212, a first connection part 213, a second bending part 214 and a second connection part 215 which extend from the edge of the display part 211 and are connected in sequence. The display part 211, the first bending part 212, the first connection part 213, the second bending part 214 and the second connection part 215 may have an integrated structure.

The display part 211 has a display surface p1 and a back surface p2 which are opposite to each other. The display part 211 may include a display region and a fanout region located on one side of the display region. The display region may include a plurality of display units for emitting light, so that the display region can display images. The surface of the display region for displaying the images is the display surface p1 of the display panel 21. An edge of the fanout region may touch an edge of the first bending part 212.

The first bending part 212, the first connection part 213, the second bending part 214 and the second connection part 215 may be located at one side of the display part 211 further away from the display surface p1, and the second bending part 214 and the second connection part 215 are located at one side of the first connection part 213 further away from the display surface p1.

The second connection part 215 may be bonded and connected to the circuit board 22. The display panel 21 may include power lines and signal lines, which transmit voltage signals to the plurality of display units in the display region. The fanout region may include a plurality of connection lines which are electrically connected to the display units of the display region.

The first bending part 212 may bend the connected first connection part 213 and second connection part 215 to one side of the display part 211 further away from the display surface p1. The plurality of connection lines of the fanout region may extend to the first connection part 213 through the first bending part 212. The second bending part 214 may bend the second connection part 215 to one side of the first connection part 213 further away from the display surface p1, so that the second connection part 215 and the first connection part 213 can be laminated at the back surface p2 of the display panel 21. At least part of the above plurality of connection lines may extend to the second connection part 215. The second connection part 215 may have a plurality of bonding pads, and the second connection part 215 may be bonded and connected to the circuit board 22 through the plurality of bonding pads. Thus, the circuit board 22 can also be located at one side of the first connection part 213 further away from the display surface p1, that is, the circuit board 22 and the first connection part 213 can also be laminated at the back surface p2 of the display panel 21.

In the embodiment of the present disclosure, the first connection part 213, the second connection part 215 and the circuit board 22 can be disposed at the back surface of the display panel 21 in a concentrated way, so that occupied space of the circuit board 22 and the first connection part 213 and the second connection part 215 of the display panel 21 in the direction parallel to the display surface is smaller, and a occupied region of the circuit board 22 and the first connection part 213 and the second connection part 215 of the display panel 21 at the back surface of the display panel 21 can be reduced.

In summary, the embodiment of the present disclosure provides a display module including the display panel and the circuit board. The display panel can be bonded and connected to the circuit board after being bent twice respectively by the first bending part and the second bending part, so that the first connection part of the display panel and the circuit board are laminated at one side of the back surface of the display panel further away from the display surface. Thus, by disposing the circuit board, the first connection part and the second connection part at the back surface of the display panel in a relatively concentrated way, the occupied region of the circuit board and the first connection part and the second connection part of the display panel at the back surface of the display panel can be reduced, and the effect of optimizing the occupied space of the display module can be realized.

Optionally, as shown in FIG. 3, the display module 20 may further include a control chip 23, the control chip 23 may be located on one side of the first connection part 213 further away from the display surface p1, and the control chip 23 may also be electrically connected to the first connection part 213. The control chip 23 may be electrically to the first connection part 213 by an anisotropic conductive film (ACF). The anisotropic conductive film refers to a type of colloid in which fine metal particles or plastic balls coated with metal on the surfaces are dispersed in a resin material. Specifically, after the anisotropic conductive film is attached between pins of the control chip (IC) 23 and the first connection part 213, the resin material can flow by using appropriate pressure and temperature, so that the conductive metal particles can be electrically connected to the pins of the control chip 23 and the connection lines in the first connection part 213. At the same time, due to the appropriate size and addition amount of the metal particles selected in the anisotropic conductive film, the metal ions between two pins cannot touch each other, thereby achieving anisotropic conduction characteristics of the anisotropic conductive film.

The circuit board 22 may also be electrically connected to the second connection part 215 through the anisotropic conductive film. The display module may also include an electronic device unit 29, and the electronic device unit 29 may include an electronic component such as a touch chip, a resistor and a capacitor. The circuit board 22 may be a flexible printed circuit (FPC) board. The circuit board 22 and the second connection part 215 may also be fixedly connected by a curing adhesive 224 to prevent the separation of the circuit board 22 and the second connection part 215.

The circuit board 22 may be located on one side of the control chip 23 further away from the display surface p1, and an orthogonal projection of the circuit board 22 on the display surface p1 overlaps with an orthogonal projection of the control chip 23 on the display surface p1. In this way, the occupied space of the display module 20 can be further reduced by laminating the control chip 23 and the circuit board 22.

Optionally, as shown in FIG. 3, the display module 20 may further include a second support pad 231, and the second support pad 231 may be located between the control chip 23 and the circuit board 22. One side of the second support pad 231 closer to the control chip 23 may have a second groove 2311, the control chip 23 may be at least partially located in the second groove 2311, and part of the surface of the side of the second support pad 231 closer to the control chip 23 may touch the first connection part 213. One side of the second support pad 231 further away from the control chip may be bonded to the circuit board 22, and the size of the second support pad 231 in the direction parallel to the display surface p1 may be slightly smaller than the size of the circuit board 22 in the direction parallel to the display surface p1. The second support pad 231 may be configured to place the circuit board 22 in order to avoid deformation of the circuit board 22 when the circuit board 22 and the control chip 23 are laminated, and also in order to avoid an extrusion phenomenon of the control chip 23 caused by the circuit board 22.

Figure 4:
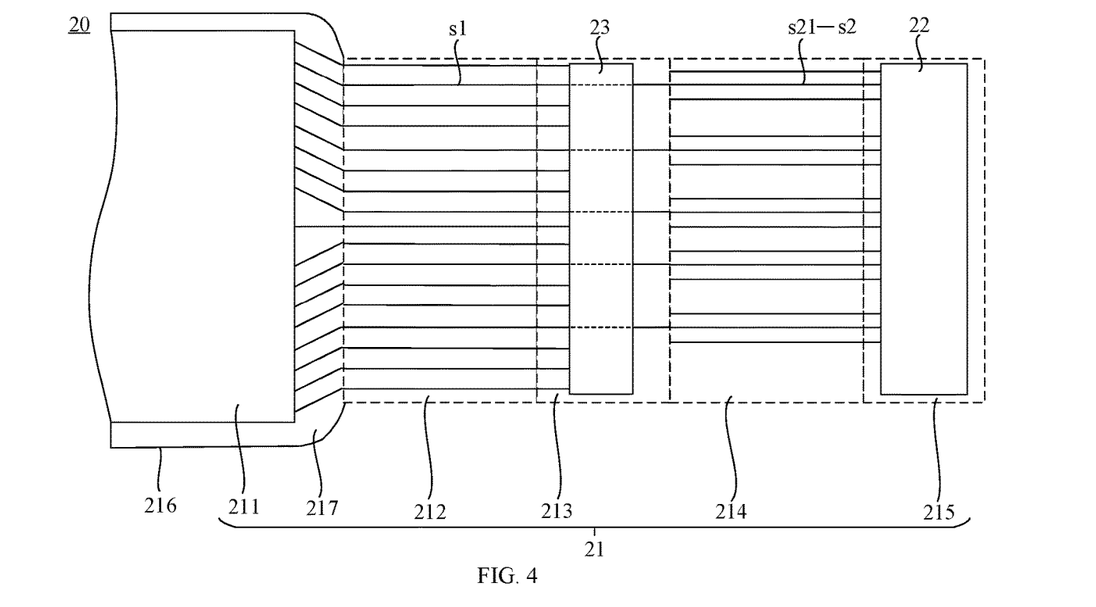
FIG. 4 is a top schematic structural diagram of a display panel according to an embodiment of the present disclosure.

Optionally, as shown in FIG. 4, FIG. 4 is a top schematic structural diagram of a display panel according to an embodiment of the present disclosure. In FIG. 4, for the convenience of showing the arrangement of the connection lines in various regions on each display panel 21, a wiring situation has been shown in which a plurality of connection lines in the display panel 21, which has not been bent, extend from the fanout region 217 to the first bending part 212, the first connection part 213, the second bending part 214 and the second connection part 215. The display panel 21 may include a substrate 216, and a material of the substrate 216 may be polyimide (PI), or polyethylene terephthalate (PET).

The first bending part 212 may have a plurality of first connection lines s1 located on the substrate 216, and the second bending part 214 may have a plurality of second connection lines s2 located on the substrate 216. The first connection lines s1 of the first bending part 212 and the second connection lines s2 of the second bending part 214 may be the same layer structures and may be formed by the same single patterning process. After the plurality of connection lines extending from the fanout region 217 pass through the first bending part 212 and extend to the first connection part 213, part of the connection lines may be electrically connected to the control chip 23 at first. Therefore, after passing through the control chip 23, the quantity of the connection lines that continue to extend to the second bending part 214 and the second connection part 215 may be less than the quantity of the connection lines before electrical connection with the control chip 23 is made.

The quantity of the first connection lines s1 in the first bending part 212 may be equal to the quantity of the connection lines extending from the fanout region, and the quantity of the first connection lines s1 in the first bending part 212 may be greater than the quantity of the second connection lines s2 in the second bending part 214. Exemplarily, when the size of the display panel 21 is 7.8 inches and the resolution is 2480*2200, the quantity of the first connection lines s1 in the first bending part 212 is about 5000, and the quantity of the second connection lines s2 in the second bending part 214 is about 930.

Since the size of a wiring space in the first bending part 212 approaches to the size of a wiring space in the second bending part 214, the wiring space of each second connection line s2 in the second bending part 214 is larger compared with the first bending part 212. The second connection line s2 may include a plurality of parallel sub-connection lines s21, so that each second connection line s2 in the second bending part 214 can be divided into a plurality of parallel sub-connection lines s21. When one or part of the plurality of sub-connection lines s21 are broken during the bending of the second bending part 214, other sub-connection lines s21 in the plurality of sub-connection lines s21 can still be in a normal electrical connection state, that is, the second connection line s2 can be in a normal electrical connection state, which can reduce the risk of open circuit of the second connection line s2, and simultaneously, can also reduce a resistance of the second connection line s2 and a heating quantity of the display module 20.

Figure 5:
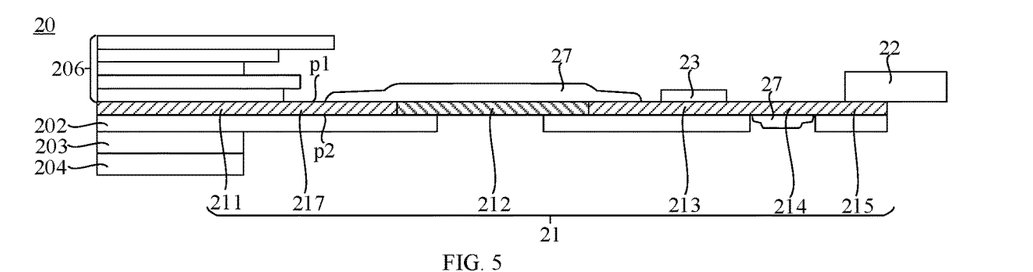
FIG. 5 is a schematic structural diagram of another display module according to an embodiment of the present disclosure.
Figure 6:
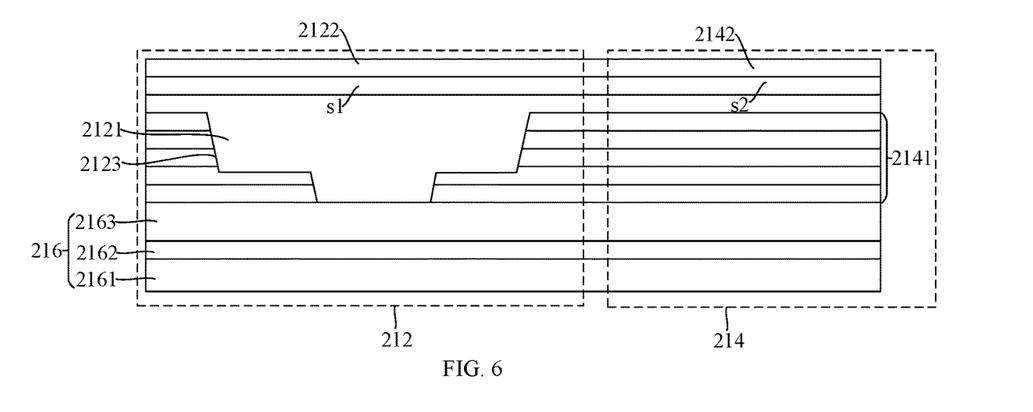
FIG. 6 is a partial cross-sectional schematic structural diagram of a display panel in the display module shown in FIG. 5.

Optionally, as shown in FIG. 5 and FIG. 6, FIG. 5 is a schematic structural diagram of another display module according to an embodiment of the present disclosure, and FIG. 6 is a partial cross-sectional schematic structural diagram of a display panel in the display module shown in FIG. 5. FIG. 5 shows a schematic structural diagram of an unfolded state of the display panel 21 in the display module 20, in which the display panel 21 is not bent, and the display surface p1 of the display panel 20 in FIG. 5 faces a direction opposite to that of the display surface p1 of the display panel 20 in FIG. 2. FIG. 6 shows a cross-sectional schematic structural diagram of the first bending part 212 and the second bending part 214.

The first bending part 212 may have a first organic insulating layer 2121, the first connection lines s1, and a second organic insulating layer 2122 which are laminated in sequence in a direction away from the substrate 216. Since when the display panel 21 is bent, the hardness of an inorganic insulating layer is greater than the hardness of the organic insulating layer, the probability of cracks in the inorganic insulating layer is greater than the probability of cracks in the organic insulating layer. When the cracks appear in the inorganic insulating layer or the organic insulating layer, the cracks will cause water vapor in an external environment to invade the inside of the display panel 21, resulting in a damage to the connection lines inside the display panel 21 due to erosion of the water vapor. Therefore, the insulating layer in the first bending part 212 may be disposed as the first organic insulating layer 2121, which can reduce the probability of the cracks in the first organic insulating layer 2121 when the first bending part 212 is bent, and can also reduce the risk of a damage to the first connection lines s1.

In a manufacturing process of the first organic insulating layer 2121 of the first bending part 212, after the inorganic insulating layer is formed on the substrate 216, a third groove 2123 may be formed in the inorganic insulating layer through a patterning process, and the third groove 2123 is filled with an organic insulating material to form the first organic insulating layer 2121.

The second bending part 214 may have an inorganic insulating layer 2141, the second connection lines s2, and a third organic insulating layer 2142 which are laminated in sequence in the direction away from the substrate 216. The second organic insulating layer 2122 and the third organic insulating layer 2142 are of the same layer structures. Since the second connection lines s1 in the second bending part 212 are less likely to be broken, the second bending part 214 may be provided with the inorganic insulating layer 2141, which can reduce the single patterning process in the process of manufacturing the display panel 21 and reduce a manufacturing difficulty of the display panel 21.

As shown in FIG. 5, the display module 20 may further include a packaging structure 206 located on one side of the display surface p1 of the display panel 21. The packaging structure 206 may be film layers of a packaging layer, a touch layer, a transparent flat layer, a transparent cover plate and the like which are laminated. The display module 20 may further include a second buffer layer 202, a bracket layer 203 (Bracket) and a bonding tape 204 (Bonding tape) which are laminated at on one side of the back surface p2 of the display panel 21. A material of the bracket layer 203 may be metal, or the bracket layer 203 may also be a super clean foam (SCF) composite membrane.

Optionally, as shown in FIG. 6, the substrate 216 may include a first flexible layer 2161, a first barrier layer 2162, and a second flexible layer 2163 which are laminated. Materials of the first flexible layer 2161 and the second flexible layer 2163 may include polyimide or polyethylene terephthalate, a material of the first barrier layer 2162 may include at least one of silicon nitride (SiNx) and silicon oxide (SiOx), which can improve a water-oxygen resistance of the substrate 216, and the first barrier layer 2162 may be called a barrier layer.

The inorganic insulating layer 2141 may be a composite film layer, which may include a film layer such as a first buffer layer, a gate insulating layer, a dielectric layer and the like. A material of the inorganic insulating layer 2141 may include at least one of SiNx and SiOx.

Optionally, as shown in FIG. 3, a bending radius of the second bending part 214 may be less than a bending radius of the first bending part 212. The bending radius R of the second bending part 214 may be greater than or equal to 0.3 mm.

As shown in FIG. 3, both the second bending part 214 and the first bending part 212 may have a cambered surface shape, a protruding direction of the cambered surface of the second bending part 214 may be opposite to a protruding direction of the cambered surface of the first bending part 212, the bending radius of the second bending part 214 may be the radius of a cambered surface p3 formed by the second bending part 214, and the bending radius of the first bending part 212 may be the radius of a cambered surface p4 formed by the first bending part 212. The display part 211, the first connection part 213 and the second connection part 215 may be disposed in parallel with each other.

Exemplarily, as shown in FIG. 3, the range of the bending radius R of the second bending part 214 may be 0.125 mm≤R≤0.34 mm. The bending radius R of the second bending part 214 is related to thicknesses of the control chip 23, the second support pad 231 and the circuit board 22, and the bending radius R of the second bending part 214 may be half of the sum of the thicknesses of the second support pad 231 and the circuit board 22. The thickness of the control chip 23 may be 0.2 mm, the thickness of the second support pad 231 may be 0.25 mm, and the thickness of the circuit board 22 may be 0.43 mm, that is, R may be 0.295 mm.

Optionally, when the bending radius R of the second bending part 214 is less than 0.3 mm, the inorganic insulating layer 2141 of the second bending part 214 may be replaced with an organic insulating layer to avoid the risk of open circuit of the second connection lines s2 in the second bending part 214.

Figure 7:
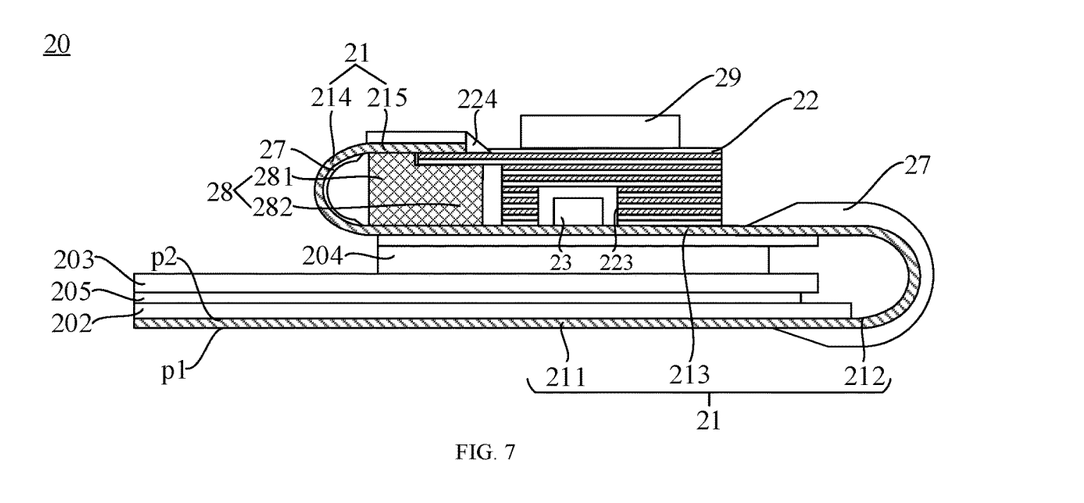
FIG. 7 is a schematic structural diagram of another display module according to an embodiment of the present disclosure.

Optionally, as shown in FIG. 7, FIG. 7 is a schematic structural diagram of another display module according to an embodiment of the present disclosure. One side of the circuit board 22 closer to the control chip 23 has a first groove 223, and the control chip 23 is at least partially located in the first groove 223. The distance between the control chip 23 and the inner wall of the first groove 233 in the direction parallel to the display surface p1 may range from 0.6 mm to 0.8 mm, and the distance between the control chip 23 and the inner wall of the first groove 233 in the direction perpendicular to the display surface p1 may range from 0.1 mm to 0.2 mm. The inner wall of the first groove 223 may be an insulating structure, the circuit board 22 may be bonded to the first connection part 213 by a layer of double-sided adhesive tape, and a thickness of the double-sided adhesive tape may be 0.05 mm.

Thus, the thickness of the display module 20 in the direction perpendicular to the display surface p1 can be further reduced, the volume of the display module 20 can be reduced, and the occupied space of the display module 20 can be saved.

The display module 20 may further include a flexible substrate 205 located between the second buffer layer 202 and the bracket layer 203, and a material of the flexible substrate 205 may include polyimide.

Figure 8:
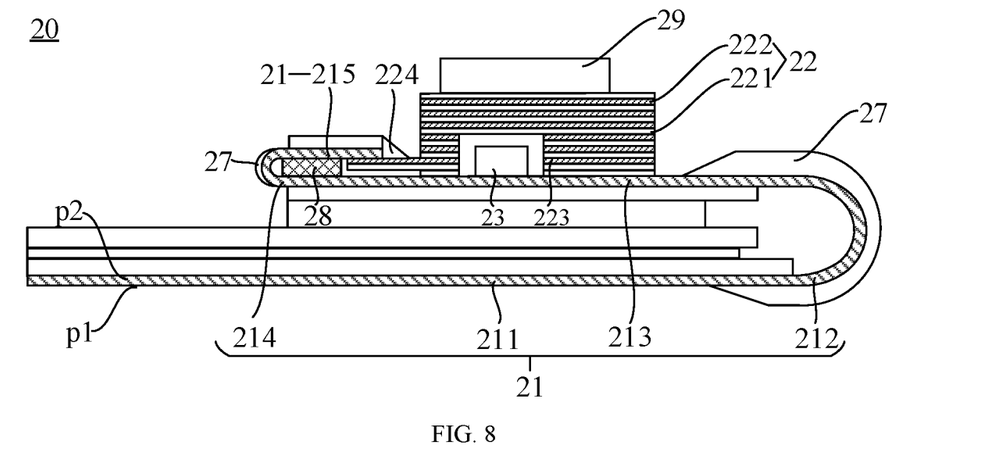
FIG. 8 is a schematic structural diagram of another display module according to an embodiment of the present disclosure.

Optionally, as shown in FIG. 8, FIG. 8 is a schematic structural diagram of another display module according to an embodiment of the present disclosure. The circuit board 22 includes a plurality of dielectric layers 221 and a plurality of layers of conductive patterns 222, the dielectric layers 221 and the conductive patterns 222 are alternately arranged in the direction away from the display surface p1, and the second connection part 215 is bonded and connected to one layer of conductive pattern 222 in the plurality of layers of conductive patterns 222 closer to the display surface p1. The layer of conductive pattern 222 in the plurality of layers of conductive patterns 222 closer to the display surface p1 may refer to any one between a middle layer of conductive pattern 222 and one layer of conductive pattern 222 closest to the display surface p1.

Exemplarily, the second connection lines s2 of the second bending part 214 may be located on one side of the substrate 216 of the second bending part 214 closer to the circuit board 22, that is, the second connection lines s2 may be located on the inner side of the second bending part 214, which can further reduce the risk of breaking of the second connection lines s2. Therefore, the bending radius R of the second bending part 214 can be smaller. The layer of conductive pattern 222 closer to the display surface p1 may refer to the layer of conductive pattern 222 closest to the display surface p1. The bending radius R of the second bending part 214 in FIG. 8 may be 0.07 mm. Compared with the second connection part 215 being bonded and connected with the layer of conductive pattern 222 which is farthest away from the display surface p1, the volume of the display module 20 is further reduced.

Exemplarily, as shown in FIG. 7, the bending radius R of the second bending part 214 may be 0.32 mm. Specifically, the bending radius R of the second bending part 214 is related to the thickness of the circuit board 22, and the bending radius R of the second bending part 214 may be one half of the result obtained by subtracting the thickness of one dielectric layer 221 (0.06 mm) from the thickness of the circuit board 22 (0.65 mm) plus the thickness of the anisotropic conductive film (0.05 mm) between the circuit board 22 and the second connection part 215.

Optionally, before the display panel 21 is bent, the second buffer layer 202 at the first bending part 212 and the second bending part 214 may be removed at first to reduce the bending difficulty of the first bending part 212 and the second bending part 214, and the size of the removed second buffer layer 202 in an extension direction parallel to the display panel 21 may be determined according to the bending radius R of the first bending part 212 and the second bending part 214. Specifically, the size L of the removed second buffer layer 202 may satisfy the following formula: L=π*R+0.2.

Figure 9:
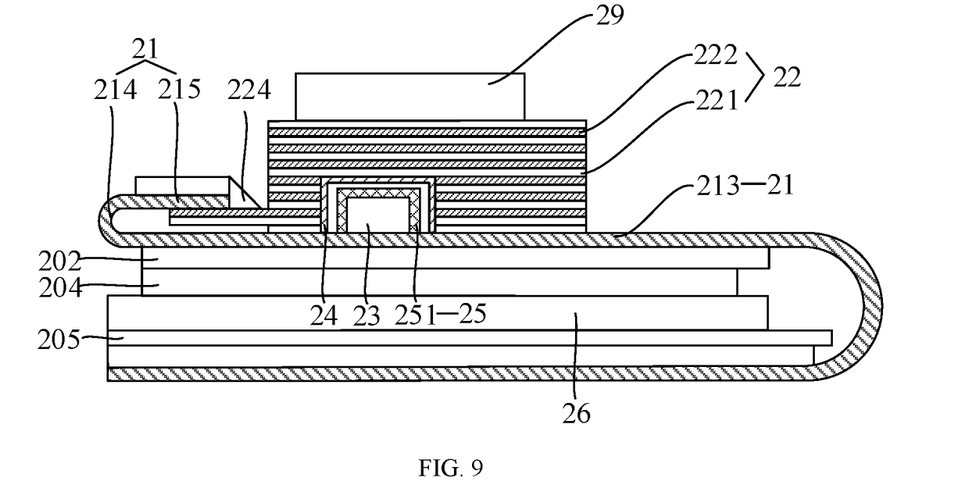
FIG. 9 is a schematic structural diagram of another display module according to an embodiment of the present disclosure.
Figure 10:
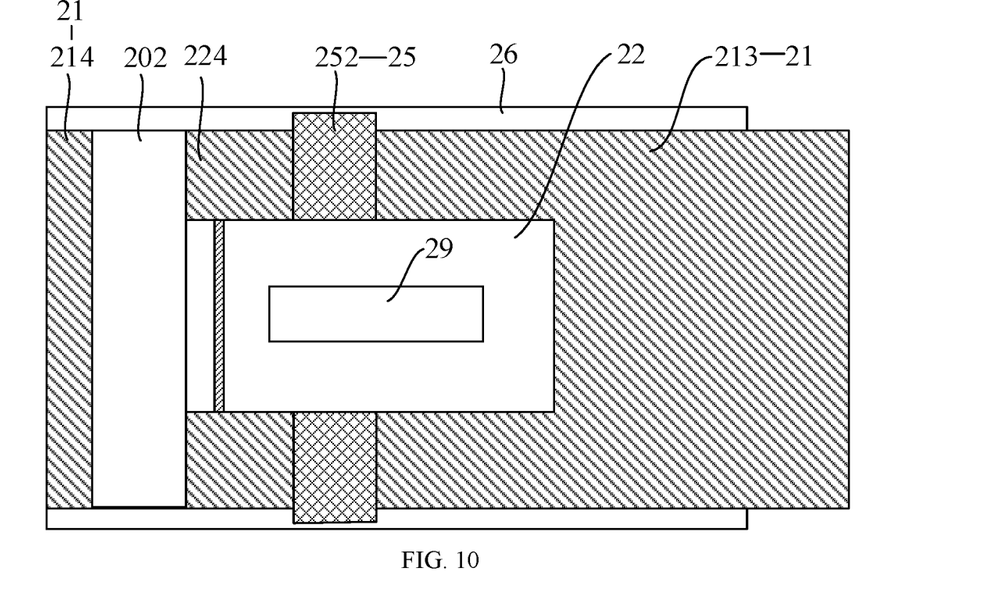
FIG. 10 is a top schematic structural diagram of the display module shown in FIG. 9.

Optionally, as shown in FIG. 9 and FIG. 10, FIG. 9 is a schematic structural diagram of another display module according to an embodiment of the present disclosure, and FIG. 10 is a top schematic structural diagram of the display module shown in FIG. 9. The display module 20 may further include a shielding layer 24, the shielding layer 24 may be located between the control chip 23 and the inner wall of the first groove 223 and fit the inner wall of the first groove 223, and a material of the shielding layer 24 may include metal. Alternatively, the shielding layer 24 may also be attached to the surface of the control chip 23. Thus, the phenomenon of signal interference between the control chip 23 and the circuit board 22 can be avoided.

Optionally, the display module 20 may further include a heat dissipation film 25 and a heat conduction structure 26, the heat dissipation film 25 has a heat absorption part 251 and an extension part 252 which are connected to each other, the heat absorption part 251 touches the surface of the control chip 23, and the extension part 252 touches the heat conduction structure 26. The heat conduction structure 26 may be a metal structure in the display module 20.

Exemplarily, the heat conduction structure 26 may be located on one side of the first connection part 213 of the display panel 21 further away from the control chip 23, that is, the heat conduction structure 26 may be a bracket layer 203 (Bracket). In other words, when a material of the bracket layer 203 includes metal, the bracket layer 203 may be reused as the heat conduction structure 26. Alternatively, the heat conduction structure 26 may also be other metal structures in the display apparatus besides the display module 20.

The extension part 252 may be a sheet-like heat dissipation structure, and the extension part 252 may extend out from the groove 223 of the circuit board 22 to touch the heat conduction structure 26. FIG. 10 shows that the heat dissipation film 25 touches the heat conduction structure 26 through the extension parts 252 located on both sides of the heat absorption part 251, and the heat dissipation film 25 may also touch the heat conduction structure 26 through the extension part 252 located on one side of the heat absorption part 251.

In an optional embodiment, the display module 20 may further include a heat dissipation film 25 and a heat conduction structure 26, and the heat dissipation film 25 has a heat absorption part 251 and an extension part 252 which are connected to each other. The area of the extension part 252 is larger, so that the extension part 252 can diffuse the heat emitted by the control chip 23 in time. In this way, the extension part 25 may be reused as the heat conduction structure 26, and the extension part 252 may not touch other heat conduction structures after extending out from the groove 223 of the circuit board 22.

A material of the heat dissipation film 25 may include silicone grease, and the heat dissipation film 25 may be attached to the surface of the control chip 23 to guide the heat generated on the chip 23 to the heat conduction structure 26, so as to prevent the temperature on the chip 23 from being too high.

Optionally, the material of the heat dissipation film 25 may also include metal, the heat dissipation film 25 is attached to the surface of the control chip 23, and the heat dissipation film 25 is also configured to shield signals between the control chip 23 and the circuit board 22. The heat dissipation film 25 may be reused as a signal shielding layer between the control chip 23 and the circuit board 22. Thus, the shielding layer 24 may not be disposed in the display module 20, and the manufacturing difficulty of the display module 20 is reduced.

Figure 11:
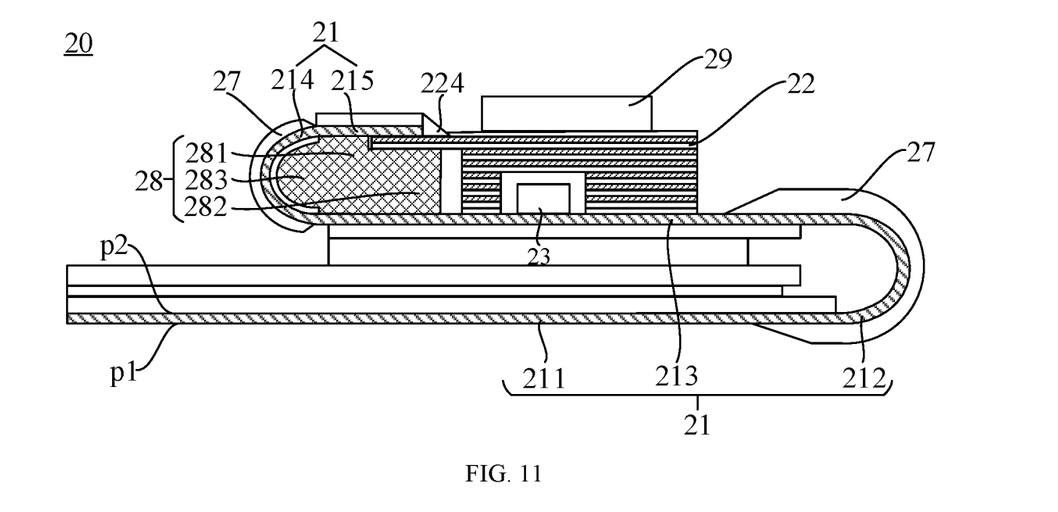
FIG. 11 is a schematic structural diagram of another display module according to an embodiment of the present disclosure.

Optionally, FIG. 11 is a schematic structural diagram of another display module according to an embodiment of the present disclosure. Please refer to FIG. 7 and FIG. 11. The display module 20 may further include a stress protection layer 27. The second bending part 214 has a concave surface and a convex surface which are opposite to each other, and the stress protection layer 27 is located on the concave surface or the convex surface of the second bending part 214.

The thickness of the stress protection layer 27 may be 0.03 mm to 0.12 mm. A material of the stress protection layer 27 may include a curing adhesive. Exemplarily, the stress protection layer 27 may be an ultraviolet curing protective adhesive (micro coating layer (MCL)), or a polyester polyurethane adhesive, etc.

When the stress protection layer 27 is located on the concave surface of the second bending part 214, the second connection lines s2 of the second bending part 214 may be located in the middle layer in a bending process of the second bending part 214 (the middle layer is subjected to a less tensile force or compressive force in the bending process), so that the risk of breaking of the second connection lines s2 of the second bending part 214 can be reduced.

Similarly, the stress protection layer 27 may also be disposed on the convex surface or concave surface of the first bending part 212. When the stress protection layer 27 is located on the convex surface of the first bending part 212, the first connection lines s1 of the first bending part 212 may be located in the middle layer in a bending process of the first bending part 212 (the middle layer is subjected to a less tensile force or compressive force in the bending process), so that the risk of breaking of the first connection lines s1 of the first bending part 212 can be reduced.

Optionally, as shown in FIG. 3, the display module 20 may further include a first support pad 28 (spacer), and the first support pad 28 may be located between the first connection part 213 and the second connection part 215 and connected to the first connection part 213 and the second connection part 215 respectively. The first support pad 28 may be bonded to the first connection part 213 and the second connection part 215 respectively. Thus, the first support pad 28 can play a supporting role and prevent the first connection part 213 and the second connection part 215 from being deformed by external extrusion. The first support pad 28 may also be configured to prevent the second connection part 215 from moving toward a direction further away from the display surface p1 under the influence of a bending stress of the second bending part 214, which can improve a stability of the second bending part 214.

The first support pad 28 may be bonded to the first connection part 213 and the second connection part 215 respectively by a double-sided adhesive tape having a thickness of 0.5 mm. The first support pad 28 is manufactured by means of an injection molding process, a numerical control machine tool process, a powder metallurgy process, etc.

Optionally, as shown in FIG. 7, the first support pad 28 may include a first support part 281 and a second support part 282 which are arranged in a direction parallel to the display surface p1. The first support part 281 is connected to the first connection part 213 and the second connection part 215 respectively, and the second connection part 215 is connected to the first connection part 213 and the circuit board 22 respectively. The first support part 281 and the second support part 282 may have an integrated structure. The size difference between the first support part 281 and the second support part 282 in the direction perpendicular to the display surface p1 is about 105 microns. The stability of the display module 20 can be further improved.

Optionally, as shown in FIG. 11, the first support pad 28 may further include a third support part 283. The third support part 283 is located on one side of the first support part 281 further away from the second support part 282, connected to the first support part 281 and has a cambered surface protruding toward the second bending part 214. The cambered surface matches the shape of the inner wall of the second bending part 214. The cambered surface may be parallel to the inner wall of the second bending part 214 (that is, the concave surface of the second bending part 214), and the distance between the cambered surface of the third support part 283 and the concave surface of the second bending part 214 may be 0.1 mm. A larger deformation can be avoided after the second bending part 214 is subjected to an external force (such as vibration and extrusion).

In summary, the embodiment of the present disclosure provides a display module including the display panel and the circuit board. The display panel can be bonded and connected to the circuit board after being bent twice respectively by the first bending part and the second bending part, so that the first connection part of the display panel and the circuit board are laminated at one side of the back surface of the display panel further away from the display surface. Thus, by disposing the circuit board, the first connection part and the second connection part at the back surface of the display panel in a relatively concentrated way, the occupied region of the circuit board and the first connection part and the second connection part of the display panel at the back surface of the display panel can be reduced, and the effect of optimizing the occupied space of the display module can be realized.

Figure 12:
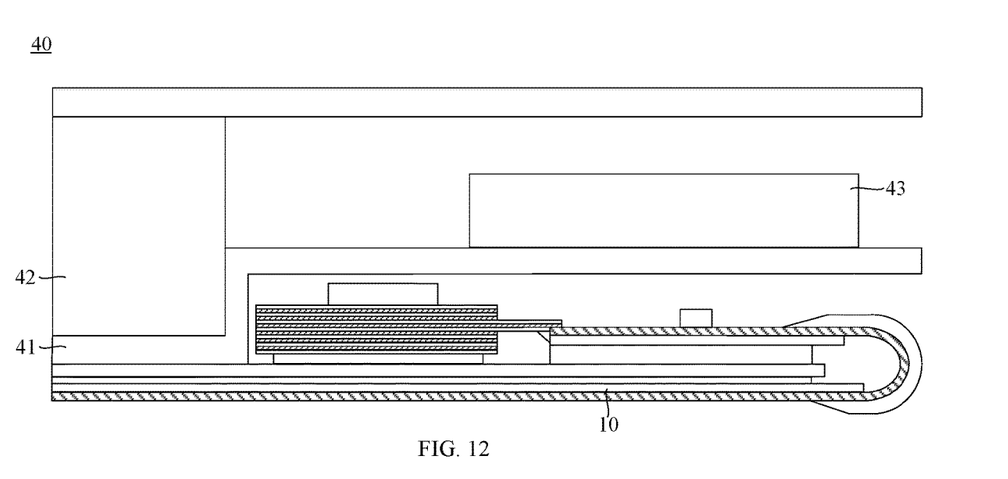
FIG. 12 is a schematic structural diagram of a display apparatus in related art.

As shown in FIG. 12, FIG. 12 shows a schematic structural diagram of a display apparatus in the related art. The display apparatus 40 may include a display module 10, a middle frame 41, a power supply assembly 42 and a circuit protection board 43.

Figure 13:
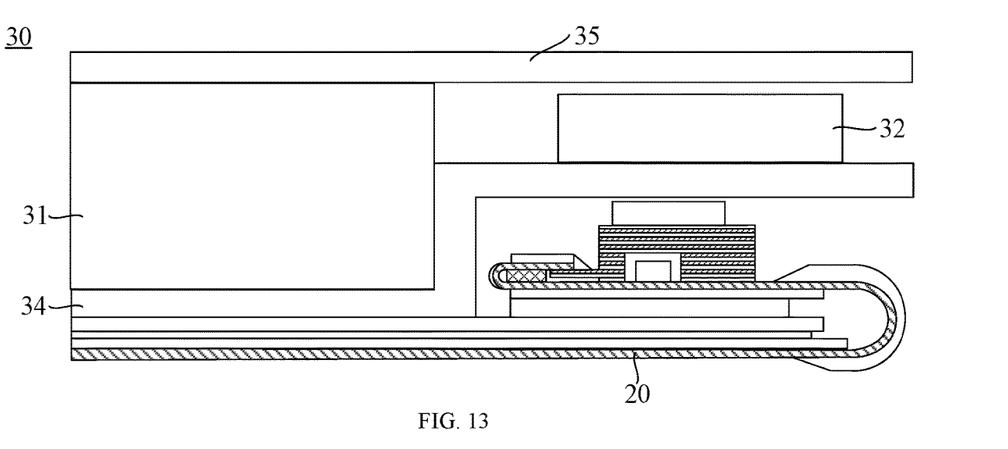
FIG. 13 is a schematic structural diagram of a display apparatus according to an embodiment of the present disclosure.

As shown in FIG. 13, FIG. 13 is a schematic structural diagram of a display apparatus according to an embodiment of the present disclosure. The display apparatus 30 may include a power supply assembly 31 and a display module 20. The display module 20 is the display module 20 in any one of the above embodiments and the power supply assembly 31 is configured to supply power to the display module 20. The display apparatus 30 may further include a circuit protection board 32, a middle frame 34, and a back cover 35. The circuit protection board 32 may be electrically connected to the power supply assembly 31, and the power supply assembly 31 may be a battery. The display panel in the display module may be a flexible display screen, such as a folding screen or a curling screen.

Compared with the display module in the related art, the display module in the embodiments of the present disclosure has a smaller size in the direction parallel to the display surface of the display panel, so that the size of the power supply assembly can be larger, and further the capacity of the power supply assembly can be larger. Exemplarily, compared with the circuit board and the connection parts in the related art, the sizes of the circuit board, the first connection part and the second connection part in the embodiments of the present disclosure in the direction parallel to the display surface of the display panel can be reduced by 7 mm to 9 mm and thus the battery capacity can be increased by 200 mAh to 260 mAh.

The term "at least one of A and B" in the present disclosure merely describes an association relationship of associated objects, and indicates three relationships. For example, at least one of A and B may indicate three cases: A exists alone, A and B exist concurrently, and B exists alone.

It should be noted that in the accompanying drawings, for clarity of the illustration, the sizes of the layers and regions may be scaled up. It can be understood that when an element or layer is described as being "above" another element or layer, the described element or layer may be directly on the other element or layer, or an intermediate layer may exist. In addition, it can be understood that when an element or layer is described as being "below" another element or layer, the described element or layer may be directly below the other element or layer, or more than one intermediate layer or element may exist. In addition, it can also be understood that when a layer or element is described as being arranged "between" two layers or elements, the described layer or element may be the only layer between the two layers or elements, or more than one intermediate layer or element may exist. In the whole description, like reference numerals denote like elements.

In the present disclosure, the terms "first", "second" and "third" are configured for descriptive purposes only and are not to be construed as indicating or implying relative importance. The term "plurality" refers to two or more, unless specifically defined otherwise.

Described above are merely exemplary embodiments of the present disclosure, and are not intended to limit the present disclosure. Within the spirit and principles of the disclosure, any modifications, equivalent substitutions, improvements, and the like are within the protection scope of the present disclosure.

The invention claimed is:

1. A display module comprising:
a display panel and a circuit board; wherein
the display panel comprises a display part, and a first bending part, a first connection part, a second bending part and a second connection part which extend from an edge of the display part and are connected in sequence;
the display part has a display surface and a back surface which are opposite to each other, the first bending part, the first connection part, the second bending part and the second connection part are located at one side of the display part further away from the display surface, and the second bending part and the second connection part are located at one side of the first connection part further away from the display surface; and the second connection part is bonded and connected to the circuit board; and
wherein the display panel comprises a substrate:
the first bending part has a plurality of first connection lines located on the substrate, the second bending part has a plurality of second connection lines located on the substrate, and a quantity of the plurality of first connection lines is greater than a quantity of the plurality of second connection lines; and
each of the plurality of second connection lines comprises a plurality of sub-connection lines connected in parallel.

2. The display module according to claim 1, wherein the display module further comprises a control chip, the control chip is located on one side of the first connection part further away from the display surface, and the control chip is electrically connected to the first connection part; and
the circuit board is located at one side of the control chip further away from the display surface, and an orthogonal projection of the circuit board on the display surface overlaps with an orthogonal projection of the control chip on the display surface.

3. The display module according to claim 1, wherein the first bending part has a first organic insulating layer, the first connection lines and a second organic insulating layer which are sequentially laminated in a direction away from the substrate;
the second bending part has an inorganic insulating layer, the second connection lines and a third organic insulating layer which are sequentially laminated in the direction away from the substrate; and
the second organic insulating layer and the third organic insulating layer are of same layer structures.

4. The display module according to claim 3, wherein a bending radius of the second bending part is greater than or equal to 0.3 mm.

5. The display module according to claim 1, wherein the circuit board comprises a plurality of dielectric layers and a plurality of layers of conductive patterns, the plurality of dielectric layers and the plurality of conductive patterns are alternately arranged in a direction away from the display surface, and the second connection part is bonded and connected to one layer of conductive pattern in the plurality of layers of conductive patterns closer to the display surface.

6. The display module according to claim 2, wherein one side of the circuit board closer to the control chip has a first groove, and the control chip is at least partially located in the first groove.

7. The display module according to claim 6, wherein the display module further comprises a shielding layer, the shielding layer is located between the control chip and an inner wall of the first groove, the shielding layer fits the inner wall of the first groove, and a material of the shielding layer comprises metal.

8. The display module according to claim 2, wherein the display module further comprises a heat dissipation film and a heat conduction structure, the heat dissipation film has a heat absorption part and an extension part which are connected to each other, the heat absorption part touches a surface of the control chip, and the extension part touches the heat conduction structure.

9. The display module according to claim 8, wherein a material of the heat dissipation film comprises metal, the heat dissipation film fits the surface of the control chip, and the heat dissipation film is also configured to shield signals between the control chip and the circuit board.

10. The display module according to claim 1, wherein the display module further comprises a stress protection layer, the second bending part has a concave surface and a convex surface which are opposite to each other, and the stress protection layer is located on the concave surface or the convex surface of the second bending part.

11. The display module according to claim 1, wherein the display module further comprises a first support pad, and the first support pad is located between the first connection part and the second connection part and is connected to the first connection part and the second connection part respectively.

12. The display module according to claim 11, wherein the first support pad comprises a first support part and a second support part which are arranged in a direction parallel to the display surface, the first support part is connected to the first connection part and the second connection part respectively, and the second connection part is connected to the first connection part and the circuit board respectively.

13. The display module according to claim 11, wherein the first support pad further comprises a third support part, the third support part is located on one side of the first support part further away from the second support part, connected to the first support part and has a cambered surface protruding towards the second bending part, and the cambered surface matches a shape of an inner wall of the second bending part.

14. A display apparatus, comprising a power supply assembly and a display module, wherein the display module is the display module according to claim 1, and the power supply assembly is configured to supply power to the display module.

* * * * *